United States Patent
Satoh et al.

[11] Patent Number: 6,007,916
[45] Date of Patent: Dec. 28, 1999

[54] SYNTHETIC SINGLE CRYSTAL DIAMOND FOR WIRING DRAWING DIES AND PROCESS FOR PRODUCING THE SAME

[75] Inventors: Shuichi Satoh; Kazuwo Tsuji; Akito Yoshida; Nobuo Urakawa, all of Hyogo, Japan

[73] Assignee: Sumitomo Electric Industries, Ltd., Japan

[21] Appl. No.: 08/247,601

[22] Filed: May 23, 1994

Related U.S. Application Data

[63] Continuation of application No. 07/887,405, May 19, 1992, abandoned, which is a continuation of application No. 07/505,291, Apr. 5, 1990, abandoned.

[30] Foreign Application Priority Data

Apr. 6, 1989 [JP] Japan ................................ 1-88517
Oct. 25, 1989 [JP] Japan ................................ 1-277393

[51] Int. Cl.$^6$ .................................................. C01B 31/06
[52] U.S. Cl. ........................... 428/408; 423/446; 117/937
[58] Field of Search ............... 423/446; 501/86; 125/30.02; 117/922, 937; 428/408

[56] References Cited

U.S. PATENT DOCUMENTS

| | | | |
|---|---|---|---|
| 4,122,636 | 10/1978 | Roy et al. | 423/446 |
| 4,401,876 | 8/1983 | Cooper | 125/39 |
| 4,617,181 | 10/1986 | Yazu et al. | 423/446 |
| 4,935,303 | 6/1990 | Ikoma et al. | 427/45.1 |
| 4,950,625 | 8/1990 | Nakashima et al. | 423/446 |
| 4,980,021 | 12/1990 | Kitamura et al. | 427/577 |
| 5,127,983 | 7/1992 | Imai et al. | 423/446 |

FOREIGN PATENT DOCUMENTS 0 136 408   4/1985   European Pat. Off. .

OTHER PUBLICATIONS

K.G. Eder, "Wire drawing dies and die working equipment", Wire Industry, vol. 53, No. 10, Oct. 1986, pp. 696–704.
Sumitomo Electric Industries, Ltd., "Diamond dies—mined or manufactured?", Wire Industries, vol. 56, No. 7, Jul. 1989, pp. 388–393.

*Primary Examiner*—Michael L Lewis
*Assistant Examiner*—Stuart L. Hendrickson
*Attorney, Agent, or Firm*—Pennie & Edmonds LLP

[57] ABSTRACT

A synthetic single crystal diamond for wire drawing die; the process of manufacturing it and a wire drawing die to utilize it are disclosed. At least one plane of the diamond for wire drawing die is a cleavage plane of (111) faces, and the drawing hole of wire drawing die lies vertical to the cleavage plane.

The diamond for the wire drawing die is produced by providing a synthetic single crystal having 20–400 ppm nitrogen of Ib type diamond. A groove is made on the diamond surface parallel to (111) faces employing energy beams such as a laser beam, an ion beam and an electron beam. A wedge is struck into the groove to cleave the diamond, and a plate is obtained. Furthermore, the plate is divided into polyhedrons, employing either an energy beam or a blade. The cleavage plane of the polyhedron is almost parallel to the (111) faces of crystal, therefore the cleavage plane is used as the standard plane to build the drawing hole.

3 Claims, 2 Drawing Sheets

SYNTHETIC SINGLE CRYSTAL DIAMOND FOR WIRING DRAWING DIES AND PROCESS FOR PRODUCING THE SAME

This is a continuation, of application Ser. No. 07/887,405, filed May 19, 1992, now abandoned. Which is a continuation, of application Ser. No. 07/505,291, filed Apr. 5, 1990, now abandoned.

TABLE OF CONTENTS

1. Background of the Invention
    1.1. Technical Field
    1.2. Background Art
2. Summary Of The Invention
3. Brief Description Of The Drawings
4. Detailed Description Of The Invention
5. Description Of Preferred Embodiments
    5.1. Example 1
    5.2. Example 2
    5.3. Example 3
    5.4. Example 4
    5.5. Example 5
    5.6. Example 6
6. Claims
7. Abstract Of The Disclosure
8. Drawings
9. Declaration And Power Of Attorney

1. BACKGROUND OF THE INVENTION

1.1. Technical Field

The present invention relates to a wire drawing die made of synthetic single crystal diamond which is used for various purposes such as drawing copper wire for winding, steel cord, stainless steel wire, welding wire, and the like; and it relates to a method of producing wire drawing dies by cleaving diamond.

1.2. Background Art

Diamond is a material having the greatest hardness and highest modulus of elasticity of all known materials. Furthermore, extremely pure diamond has additionally the highest thermal conductivity and the highest transmittance in the infrared spectrum. Thus, diamond is a material for which there are no comparable substitutes.

There are two general methods for synthesizing diamond using high temperature and high pressure. In one method, carbon material to be converted to diamond is mixed or brought into contact with a solvent metal such as iron, cobalt or nickel. A stable high pressure and temperature whereby the carbon is converted into diamond under the action of the solvent metal is used. According to such a method, the solvent metal penetrates into the carbon material, whereby the carbon is caused to diffuse through the solvent metal which is in the form of a thin film, to generate diamond. According to this method, diamond is spontaneously nucleated, and rapidly grows until it reaches a certain size. Considerable quantities of fine diamond powder have been synthesized by this method to be applied to, e.g. abrasives. However, large diamond crystals of high quality cannot be synthesized by the aforementioned method.

On the other hand, a method of synthesizing large diamond crystals of good quality is disclosed in U.S. Pat. No. 3,297,407 issued Jan. 10, 1967 to R. H. Wentorf, Jr. Furthermore, U.S. Pat. No. 4,632,817 issued Dec. 30, 1986 Yazu, provides a method for synthesizing a number of large diamond crystals of high quality simultaneously from a plurality of seed crystals. This method is generally called a temperature gradient method.

The present invention relates to using a diamond synthesized by the temperature gradient method.

Most diamond crystal dies are made of natural diamond, whose (110) or (111) faces are polished and then at least one face vertical to said faces is also polished for observation of holing. After the preparations, a wire drawing hole which is vertical to (110) or (111) faces is formed by a laser beam, electric discharge or ultrasonic grinding, while observing through the polished face. Synthetic diamond crystals have been marketed and various attempts to use them for wire drawing have been carried out.

However, the tool life using the prior art displayed a wide range and it causes a lack of reliability. Especially, the tool life made of natural single crystal diamonds can vary widely for the following reasons.

First, the faults of the natural diamond crystal wire drawing dies are the following: It is said that the die having a wire drawing hole vertical to the (110) face, has generally the highest wear resistance and the longest life as shown on Junkatsu (Lubrication), vol. 112, No. 11, 1967. However, the tool life of the dies have such a range according to following reasons.

Second, it is difficult to judge precisely where the (110) face is because natural diamonds have been rounded, and have variety of shapes depending upon the degree of dissolution. As a result, it requires considerable skill to determine the (110) faces of a natural diamond used as wire drawing dies. Therefore, most of the wire drawing hole directions are not intended, and it makes the tool life short.

Third, according to the natural diamond, they often have a soft portion and hard portion on one single crystal; the wire drawing hole has partial wear during drawing and such wire drawing holes are deformed varying from complete circles to distorted ones. This is the cause of a shortened tool life.

Recently, high quality synthetic diamond has been obtained by the temperature gradient method and is on the market. In spite of the many attempts to use the synthetic diamond for a wire drawing die, a high quality wire drawing die has not been obtained yet and the reasons are the following:

First, synthesized or slightly polished idiomorphic diamond is generally used for the wire drawing die. In order to hold the diamonds to the tool holders, hexahedron diamond is suitable. This is mainly covered with (100) faces, and the wire drawing holes are vertical to the (100) faces. However, a drawing hole of such direction has inferior wear resistance and a short tool life.

Second, some of the synthetic diamonds don't have uniform concentration of nitrogen. This causes partial wear of the drawing hole.

Third, when the diamond is held to a tool holder using the surfaces of grown diamond or polished surfaces, it requires a large stress to hold the diamond in place, because the friction coefficient between the diamond surfaces and holder is very low. Therefore, the wire drawing die often cracks during drawing.

Concerning the dividing diamond method, cutting and cleavage are well known. In the former method, there are two ways; one of which is represented by the following. A cutting blade in which diamond particles are embedded rotates at high speed, presses forward on the diamond and performs the cutting. The other is thermal cutting, for example, using a laser beam.

Concerning the latter method, a diamond is grooved by the other diamond or a cutting blade and then a knife-shaped wedge is struck in the groove and a diamond is cleaved, as shown on pages 411–412 of Kesshokogaku Handbook. The latter is thought to be the best method to divide a diamond economically, taking advantage of diamond's propensity to be easily cleaved parallel to the (111) faces. The method does not require a width loss equal to the cutting blade, especially when compared to the former method and also does not require a great deal of time to divide.

However, only commercial diamond cutters use this method to divide large diamonds for jewelry and ornamental applications. According to this method, it requires a high level of skill, and the possibility to destroy a high priced diamond is great, and also makes the probability of an uneven divided plane high, as shown in Diamond (Sanyo Shuppan Bouekiu Ltd.), pages 216–218 and "Ceramics" 11 (1976) No. 6 page 520, the method is not used in industrial fields. In addition, it is impossible to divide a diamond to get plural, thin and uniform plates which are indispensable for heat sink and wire drawing dies.

The subjects of the prior art have been made clear by the present inventors' research. They are: The angle between the groove and the cleavage plane (111) faces must be at most 0.5° to obtain an even cleavage plane. However, it is impossible to groove such accuracy using another diamond or a cutting blade because a diamond is hard enough to get such an accuracy of 0.5". Also, the lineability of the groove has to be within 0.1 mm to cleave, but it is very difficult to groove-in such accuracy using the prior arts.

2. SUMMARY OF THE INVENTION

The object of the present invention is to provide a diamond for wire drawing die made of a synthetic single crystal diamond.

Another object of the present invention is to provide a high quality wire drawing die which is made of synthetic single crystal Ib type diamond containing nitrogen between 20–400 ppm, made of at least one plane consisting of two vertical planes to drawing direction is cleavage plane of (111) faces and an angle between a center line of a wire drawing hole and said cleavage plane of (111) faces is between 87–93°, using the cleavage plane as a standard plane.

Another object of the present invention is to provide a method to produce, the diamond for wire drawing die.

Another object of the present invention is to provide an improved process for cleavage.

The disclosed process for manufacturing a diamond for wire drawing die involves a groove on a single crystal diamond whose groove is parallel to the (111) faces and whose groove is made by an energy beam selected from a group consisting of: an electron beam, an ion beam and a laser beam, and then a wedge is struck into the groove to divide the single crystal diamond. This process can be applied to a synthetic diamond and a natural diamond.

3. BRIEF DESCRIPTION OF THE DRAWINGS

FIG. 4 shows typical single crystal diamonds. In particular.

4. DETAILED DESCRIPTION OF THE INVENTION

Figure 1:
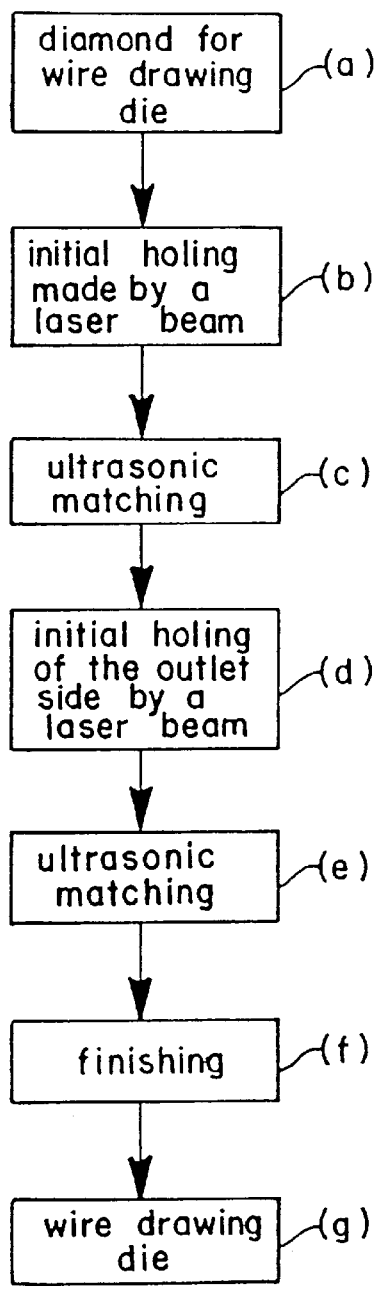
FIG. 1 is a schematic diagram of the process for making the wire drawing die.

This invention relates to a synthetic single crystal diamond of an Ib type which contains nitrogen between 20–400 ppm and is synthesized by the temperature gradient method. Generally, the nitrogen in the synthetic single crystal diamond of an Ib type is isolated and distributed. There is a tendency in the Ib type synthetic single crystal diamond where the larger the concentration of the nitrogen the smaller the wear during drawing. However, when the concentration of the nitrogen exceeds 400 ppm, the wear increase. On the other hand, when the concentration of the nitrogen is below 20 ppm, the diamond only partially wears. These relationships between the concentration of nitrogen and wear were found. This invention provides an excellent synthetic diamond for wire drawing die which shows little wear and wears uniformly depending on the concentration of nitrogen, between 20 to 400 ppm.

Therefore, when the concentration of the nitrogen is out of this range, the wire drawing hole wears unevenly because of the difference of the concentration of nitrogen. Then the wire drawing hole is transformed to an irregular shape useless four wire drawing. Or the wire drawing hole becomes enlarged rapidly, and a short tool life is the result even after little.

This invention provides a wire drawing die whose drawing direction is parallel to the <111> direction and whose hole is built precisely vertical to the (111) faces using a cleavago plane (111) as a standard plane to minimize the discrepancy from the <111> direction. Inventors find that the wear resistance of synthetic single crystal diamond is not so dependent upon the face index as a natural diamond. Concerning the synthetic single crystal diamond, the wear of the <100> direction is great, however the wear of the <111> and <110> directions, are less than the 100 direction and nearly the same as each other. Generally, the wear resistance of natural diamond strongly depends on the direction of the crystal, and the wear of the <111> direction is less than the <110> direction.

It is found that the wear resistance of the wire drawing hole depends strongly on the discrepancy of the angle between the center line of the drawing hole and the <111> direction. In order to minimize this discrepancy, it has been found to be quite useful that as the (111) faces are vertical to the <111> direction, the cleavage plane of the (111) faces can be used as the standard plane and the wire drawing hole can be made precisely vertical to the cleavage plane.

A diamond which is synthesized by the temperature gradient method is mostly idiomorphic. Therefore, it is precise and easy to discriminate the plane index, and also it is easy to cleave the (iii) faces of the desired size of an idiomorphic single crystal diamond. In addition, it is found that the cleavage plane of the synthetic diamond is smooth and even. On the other hand, natural diamonds have been generally rounded, and have a variety of shapes depending upon the dissolution. As a result, it requires considerable skill to determine the proper orientation of a crystal which can serve as a wire drawing die. In many cases, the cleavage planes of natural diamonds have cleavage bandings, many large steps and spiral steps. Furthermore, other (111) faces which have different directions appear.

Figure 3:
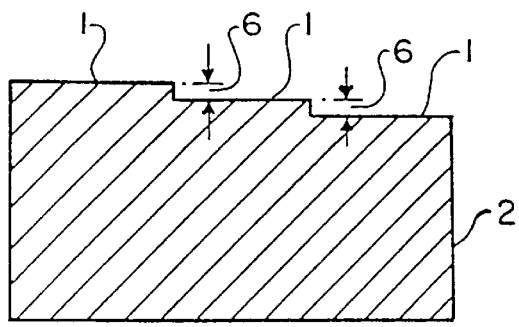
FIG. 3 is a cross-sectional view of the cleavage plane.

In order to make the wire drawing hole vertical to the (111) faces, the surface roughness of the standard cleavage plane (111) plays an important role and is at most 100 μm. In this case, the surface roughnesses are equal to the height of a step 6 between two cleavage plane 1 in FIG. 3. A cut plane 2, using a laser beam, is shown in FIG. 3. To estimate the cleavage plane, the height and the number of steps are important factors, and the preferable embodiment is a 30–100 μm height and also at most 3 steps of 1 mm lengths.

When the number of the steps is larger than 4 of a 1 mm length, it is impossible to define precisely the <111>. direction; therefore, it is difficult to make the drawing hole exactly in the <111> direction.

In order to hold the drawing die tightly to the tool holder, at least one side is roughed by cutting thermally, for example, using a laser beam, to increase the coefficient of friction.

Accordingly, as to the surface of the synthetic diamond as it is grown, it is smoother than the surface of natural diamond, and much stress is required to hold the wire drawing die to the tool holder using the rough surfaces. When holding on a polished surface, a large stress is also necessary. Such large stress causes cracking of the die during drawing.

This invention provides a solution to lower the compressive stress, because at least one side is a rough surface made by an energy beam cutting such a laser beam, an ion beam or an electron beam. The preferable surface roughness is between 5 to 100 $\mu$m. When the surface roughness is less than 5 $\mu$m, a large compressive stress is indispensable to hold the die to the tool holder due to a small friction coefficient. On the other hand, when the surface roughness is more than 100 $\mu$m, a stress concentration occurs on the uneven surface and this causes the initiation of cracking.

This invention is a wire drawing die having an angle within 3° between the center line of the wire drawing hole and the <111> direction of the diamond. The discrepancy is the angle between the <111> direction and the center line of the wire drawing hole and is one of the most important factors for wear resistance during drawing. The larger the discrepancy, the less the wear resistance of the wire drawing hole.

This invention also provides an improved wire drawing die which has the characteristics of long tool life with a narrowed range when the angle discrepancy between the cleavage plane of the (111) faces and the center line of the drawing hole is between 89° to 91°. The cleavage of a single diamond is necessary for this invention.

A (111) plane of synthetic single crystal rough diamond may be used as the standard plane for making the wire drawing hole to lower the angle discrepancy, however, this method is inferior in that the shape of the wire drawing die becomes close to the shape of a single diamond and whose shape is not easily controlled; also a single diamond having a large (111) plane area must be selected.

This invention also provides a method to produce the wire drawing die having a long tool life. This invention involves the next two processes.

The first is that a surface of a single crystal diamond is grooved parallel to the (111) faces by a method selected from the following group; an ion beam, an electron beam and a laser beam. Using an X–Y table having a moving apparatus, the (111) faces of the single crystal diamond are adjusted parallel to the X or Y axis of the table and also parallel to the energy beam and then the single crystal diamond is easily grooved. This process is preferred as an effective means for the next cleavage process, in order to cleave reliably and precisely without considerable skill in the prior arts. After grooving on the surface of the single crystal diamond, a sharp plate such as a wedge or a knife made of metal or ceramic is set into the groove and the sharp plate is forced into the groove parallel to the (111) faces and then the single crystal diamond is divided completely. Hammering, pressing, or the stress of thermal expansion can be used to force the sharp plate into the groove.

Generally, the length of the wedge is longer than that of the groove. However, there is no limit to the length of the wedge; specifically, the length of the knife should be shorter than the groove. Furthermore, a needle is occasionally used as a wedge. This improved process has no match in ease, reliability and precision to divide a diamond, compared to the prior arts such as the method using a laser beam which was said to be the most reliable and precise method to divide a single crystal diamond. Since the groove becomes V shaped, when the energy beam is used, good results are obtained. These processes can be applied to a synthetic single crystal diamond and a natural single crystal diamond.

Figure 4A:
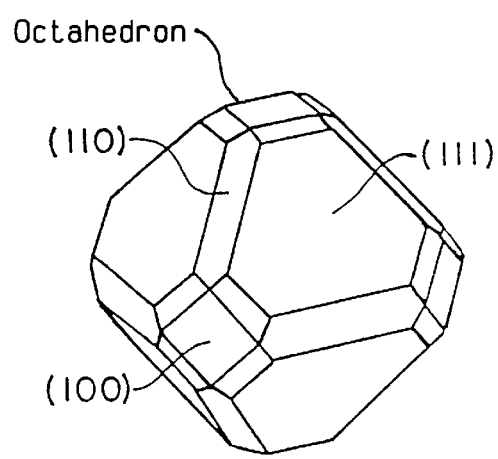
FIG. 4(a) is an octa-hexahedron.
Figure 4B:
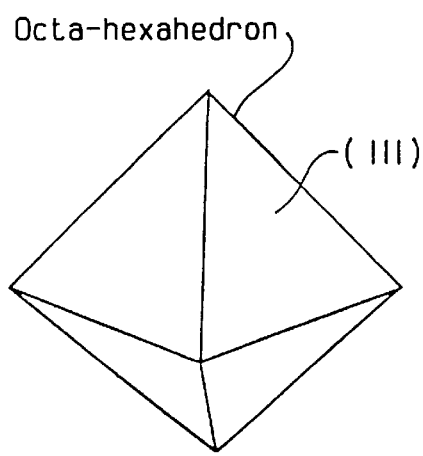
FIG. 4(b) is an octahedron and FIG. 4(c) is a hexahedron.
Figure 4C:
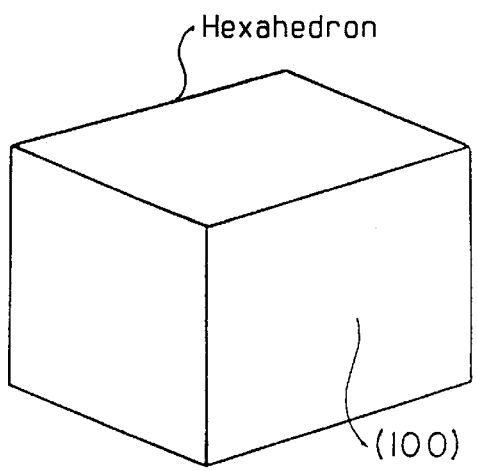

A large and good quality synthetic single crystal diamond is more preferable than a natural single crystal diamond, because it is reliable, easy and precise to divide a single crystal diamond. As aforementioned, most of the natural single crystal diamond was dissolved in the earth, and the surfaces are curved or uneven, therefore it is difficult to discriminate the (111) faces from the external appearance, whose faces are indispensable for cleavage of single crystal diamond. There is a method however to discriminate a plane index using X-ray. But this method takes much time and many steps, so that it is said that this method is not efficient economically. On the other hand, the synthetic single crystal diamond is generally polyhedron surrounded by the (111) faces and the (100) faces as shown in FIG. 4. Therefore it is easy to discriminate the (111) faces from the external appearance, and it is also preferable to use the synthetic single crystal diamond for this invention. When the single crystal diamond is set on the X–Y table to groove, it is easy to adjust the single crystal diamond within an accuracy of 0.1° between the (111) faces and the grooving direction, thus, the grown plane (111) of the diamond is only fixed to the standard plane, which is parallel to the moving direction on the X–Y table.

In addition, a synthetic single crystal diamond which is larger than 1.5 mm in diameter, larger than 1/30 carat size and of high quality, is superior to a synthetic crystal diamond which is generally called an abrasive in the market and smaller than 1 mm in diameter. The abrasive is too small to handle and the quality is not sufficient for use in wire drawing dies.

These processes certify the lineability of the groove within 0.1 mm and the discrepancy of an angle between the (111) faces of the diamond and the cleavage plane (111) within 0.5°. Therefore, the cleavage plane (111) can be used as the standard plane to build the wire drawing hole.

When the wire drawing hold becomes enlarged from normal wear and erosion, the hole can be re-shaped for drawing larger wire.

5. Description of Preferred Embodiments

5.1. EXAMPLE 1

Five Ib type single crystal diamonds, which contained 10–500 ppm of nitrogen and were of 0.4–0.6 carat size, were synthesized under a pressure of 5.5 GPa and a temperature of between 1300° C. to 1400° C., employing the temperature gradient method and various solvent metals. These synthetic single crystal diamonds had cleaved (111) faces, and a 1.5 mm thick plate was obtained. And then the plates were cut into a hexahedron of 2 mm×2 mm×1.5 mm using a laser beam. Furthermore, a cut side using a laser beam was polished and a diamond for wire drawing die was obtained. The polished surface was the (110) face. The height of the step on the cleavage plane was 60 $\mu$m. The three surface roughness of the sides cut by the laser beam were 40 $\mu$m.

Figure 2:
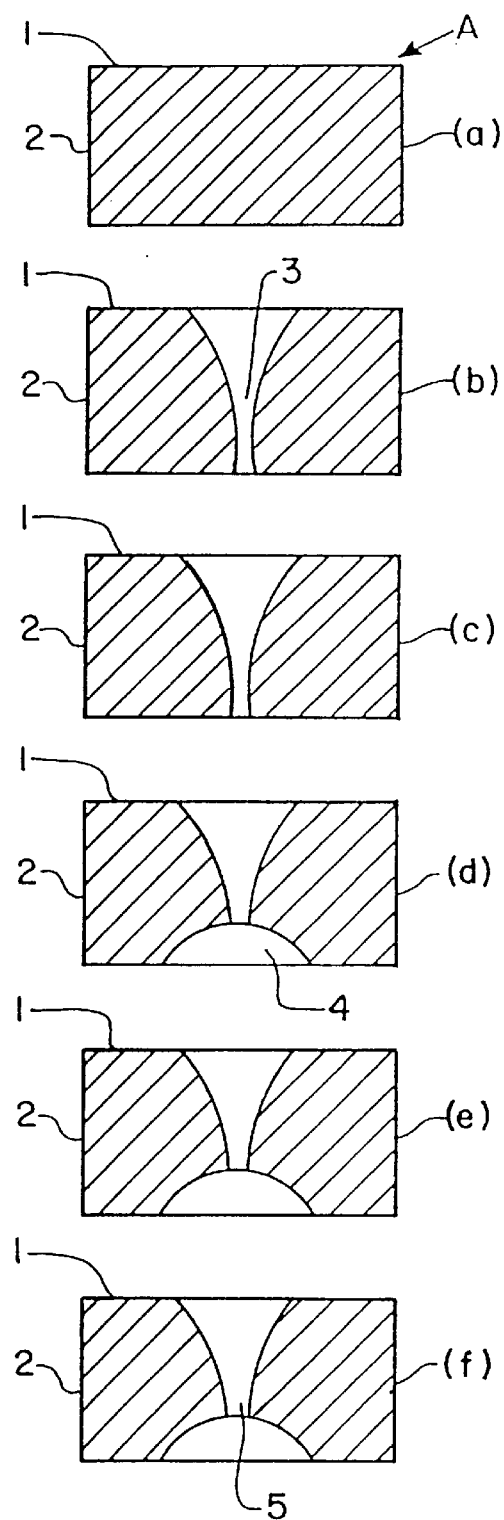
FIG. 2 is a cross-sectional view, showing a wire drawing hole in each step of FIG. 1.

Each diamond was worked into a wire drawing die, following the process of FIG. 1. FIG. 2 shows the shape of the wire drawing hole corresponding to FIG. 1. A diamond for wire drawing die A in FIG. 2(a) (1 is cleavage, 2 is the cut side by laser) was had an initial hole 3 made by the laser beam as shown in FIG. 2(b), and then the surface of the initial hole was polished smooth by ultrasonic machining as shown in FIG. 2(c). The opposite side of diamond A had an initial hole 4 made by the laser beam as shown in FIG. 2(d), and then the surface of the initial hole was also polished smooth by ultrasonic machining as shown in FIG. 2(e). Lastly, a wire passed through the wire drawing hole 5 to provide a finish and the wire drawing die was obtained as shown in FIG. 2(f). A diameter of the wire drawing hole was 40 μm obtained by measuring the diameter of the wire. Each wire drawing die was settled in a holder and employed for copper drawing.

The results are shown below in Table 1.

TABLE 1

| Experiment No. | 1 Comparison | 2 Example | 3 Example | 4 Example | 5 Comparison |
|---|---|---|---|---|---|
| Synthesis Temperature (°C.) | 1350 | 1300 | 1350 | 1390 | 1400 |
| Solvent metal (°C.) | Fe-5Ni | Fe-20Ni | Fe-50Ni | Fe-80Ni | Ni |
| Concentration of nitrogen (ppm) | 10 | 20 | 100 | 400 | 500 |
| Weight of copper wire passing through the die (kg) | 50 | 250 | 310 | 290 | 60 |
| Cause of tool life decrease | Partial wear(*) | Diameter too large() | Diameter too large() | Diameter too large(**) | Partial wear(*) |

(Caution)
*Partial Wear: wire drawing hole had partial wear and the hole was distorted
**Diameter too large: the wire drawing hole showed uniform wear and the hole was enlarged Table 1 shows that the wire drawing dies which contain nitrogen between 20 to 400 ppm, have excellent properties.

5.2. EXAMPLE 2

Six single crystal diamonds which were of a 0.3 carat size where synthesized under a pressure of 5.5 GPa and a temperature of 1350° C., employing the temperature gradient method and Fe-50 Ni as the solvent metal. Three wire drawing dies whose sizes were 1.4 mm×1.4 mm×1.1 mm, had 30 μm diameter wire drawing holes, and were obtained in the same process as Example 1. The surface of 1.4 mm×1.4 mm were cleavage planes, and had a wire drawing hole directed to the thickness direction of 1.1 mm.

The other three diamonds were polished, substituted for cleavage into plates of 1.1 mm thickness. Then, the diamonds were worked into the wire drawing die which had 30 μm diameter wire drawing holes and a size of 1.4 mm×1.4 mm×1.1 mm using the same process as Example 1. The wire drawing holes were vertical to the surfaces of 1.4 mm×1.4 mm. The concentration of nitrogen in the diamond was between 80 to 100 ppm. This concentration was estimated from the infra-red adsorption coefficient at 1130 cm$^{-1}$. The height of the steps on the cleavage plane was between 50 to 60 μm. The surface roughness of the cut side by laser beam was between 25 to 30 μm. The surface roughness of the polished side was 0.1 μm. After measuring the angle between the center line of the wire drawing hole and the cleavage plane or polished plane using an X-ray apparatus for measuring the direction of crystal, the wire drawing dies were employed for copper wire drawing. The results are shown below in Table 2. All of the wire drawing holes became enlarged, and their tool life shortened.

TABLE 2

| Experiment No. | 6 Example | 7 Example | 8 Example | 9 Comparison | 10 Comparison | 11 Comparison |
|---|---|---|---|---|---|---|
| Using a method with the plane vertical to the wire drawing hole | Cleavage | Cleavage | Cleavage | Polished | Polished | Polished |
| Angle between the <111> direction and the cleavage plane or polished plan | 87° | 90.5° | 89° | 94° | 95.5° | 85° |
| Weight of copper wire passing through the die (k$_2$) | 280 | 360 | 330 | 130 | 110 | 100 |

Table 2 shows that the wire drawing dies having a cleavage plane as (111) faces is preferable to having a polished plane, and the wire drawing dies having an angle between 87–90° were preferred embodiments, and the angle between 89 and 90° were the best embodiments.

5.3. EXAMPLE 3

A single crystal diamond of 0.8 carat size, was synthesized under a pressure of 5.5 GPa and a temperature of 1350° C., employing the temperature gradient method and Fe-50 Ni as the solvent metal, and then the single crystal diamond was cleaved into two plates of a 0.6 mm thickness. Two wire drawing dies were made from each plate in the same process as example 1 and the sizes were 1 mm×mm×0.6 mm. The diameter of drawing wire was 30 μm.

In addition, two natural diamonds were purchased, and cleaved using a diamond face which seemed to be similar to a face (111) face, and two plates having a 0.6 mm thickness were obtained, and then two wire drawing dies were made in the same process as example 1. The size of dies were 1 mm×mm×0.6 mm. The concentration of nitrogen in the synthetic diamond was 90 ppm. The concentration of nitrogen in the natural diamonds were 1250 ppm and 2000 ppm.

Table 4 shows that the diamonds whose surface texture was between 5 and 100 μm, provided better results.

5.5. EXAMPLE 5

Seventy natural diamonds, which were of a 1.0–1.1 carat size of an octahedron-like roundness, and did not contain impurities except for trace amounts of nitrogen, were divided into seven sets and each set contained of 10 natural

TABLE 3

| Experiment No. | 12 Example | 13 Example | 14 Comparison | 15 Comparison |
|---|---|---|---|---|
| State of the cleavage plane | Even | Even | Spiral Steps | Other (111) faces faces appearing |
| Height of the step (μm) | 20 | 100 | 150 | 150 |
| Number of steps having 30–100 μm height | 0 | 3 | 5 | 4 |
| Kind of diamond | Synthesized Ib | Synthesized Ib | Natural Ib | Natural Ib |
| Weight of copper wire passing through the die (kg) | 260 | 250 | 100 | 80 |

The wire drawing dies which had a step height below 100 μm had an advantage over the others.

5.4. EXAMPLE 4

Five single crystal diamonds of 0.5–0.6 carat size, were synthesized under a pressure of 5.3 GPa at a temperature of 1300° C. employing Fe-30 Ni as the solvent metal. The concentration of nitrogen was between 40–500 ppm. Five drawing dies of 2 mm×2 mm×1.5 mm were made in the same process as Example 1. In one of them, all the sides cut by laser were polished. The sides of the other four were cut using various laser beam conditions to provide various surface roughness, and then, one side of each drawing die cut by a laser beam was polished. The polished surfaces were the (110) faces and (112) faces. These wire drawings were fixed to the holder, arid wire drawing testing was carried out. The results are shown below in Table 4.

diamonds. Ten synthetic diamonds, which were also of a 1.0–1.1 carat size in a hexa-octahedron as in FIG. 4(a) and did not contain impurities except for trace amounts of nitrogen, were prepared. These eighty diamonds were provided for the following cutting tests, and Table 5 shows the results. All the diamonds were cut in two using the four prior art methods and the four methods of our present invention. The ratio of those suffering no destruction using cleavage is shown below in Table 5.

The Four Prior Art Methods Experiment No. 21
Cutting by Blade

A disk of 0.15 mm thickness made of phosphor bronze was inserted in the cutting machine and a kneaded mixture of about 10 μm diamond powder with machine oil was rubbed on the circumference of the blade. The blade rotated at 8,000 r.p.m. and then the blade was ground the surface of a natural diamond, and the diamond was cut. Marks of the blade were revealed on the cut surface and also the cut surface had a curve of more than 0.1 mm.

TABLE 4

| | 16 | 17 | 18 | 19 | 20 |
|---|---|---|---|---|---|
| Experiment No. | Comparison | Example | Example | Example | Comparison |
| Method of working the side | Polished after laser cutting | Laser cutting | Laser cutting | Laser cutting | Laser cutting |
| Surface roughness of the side (μm) | 1 | 5 | 20 | 100 | 150 |
| Holding pressure (kg/mm²) | 60 | 30 | 20 | 20 | 20 |
| Weight of copper wire passing through the die (kg) | 30 | 240 | 310 | 270 | 50 |
| Cause of tool life decrease | Cracking | Enlarged diameter | Enlarged diameter | Enlarged diameter | Cracking |

Experimental No. 22

Cutting by Laser-Beam

A natural diamond was set on an X–Y table, and then cut by a YAG laser beam of 20 watts, moving the table in a prescribed direction. There were many vertical stripes on the cut side due to the pulse laser. Furthermore the cut side had an inclination of 2–6° to the laser beam, and was not parallel to the vertical direction of the table. The inclination around the inlet portion of the laser beam differed from the inclination around the outlet portion, therefore the cut side was curved.

Experiment No. 23

Cleavage After Being Flawed by a Diamond

After flawing a surface of natural diamond using another sharpened diamond, a steel wedge which had lead angle of 20° was wedged into the flaw by a hammer. As a result a great many of the natural diamonds were destroyed and the yield was as low as 30%. In addition, the cleavage planes of diamonds which were destroyed, were curved and shaped like a shell.

Experiment No. 24

After grooving the natural diamond employing the blade used in experiment No. 21, the diamond was cleavaged by the same method as Experiment No. 23. The cleavage planes were rather improved over No. 23.

The Four Methods of This Invention

Experiment No. 25

The natural diamond was set on the X–Y table with the (111) faces parallel to the Y axis; a surface of the natural diamond was grooved by a YAG laser beam of 5 watts and the X–Y table moved toward the Y axis. The groove had a 0.08 mm width at the inlet of the laser beam, 0.3 mm depth and has V-shaped. A steel wedge having a lead angle of 20° was wedged into the groove by a hammer, and the natural diamond was cleaved.

The cleavage plane was more flat than the plane obtained by experiment Nos. 23 and 24.

Experiment No. 26

The natural diamond was set on a X–Y table in the same way as experimental No. 25 whose table was settled in a vacuum chamber, and then the pressure of the vacuum chamber was lowered to $10^{-4}$ torr. An electron beam grooved the surface of the natural diamond, and the groove had a 0.1 mm width at the inlet of the laser beam, a 0.25 mm depth and was V-shaped. Furthermore, the natural diamond was cleaved in the same way as No. 25.

Experiment No. 27

An Ar ion beam was substituted for the electron beam used in experiment No. 26; the other processes were the same as for No. 26.

Experiment No. 28

A synthetic diamond of a 1.0 carat size having a hexa-octahedron shape was put in the place of a natural diamond a as in experiment no. 25. The other processes were the same as for No. 25.

TABLE 5

| Experiment No. | Method of dividing | Kind of diamond | Grooving method or cutting method | Mean surface flatness of the divided plane (mm) | Mean cutting width (mm) | Time of one division (min) | Yield (%) | Number of cut diamonds |
|---|---|---|---|---|---|---|---|---|
| Comparison | | | | | | | | |
| 21 | Cutting | Natural | (Blade) | 0.15 | 0.21 | 45 | 100 | 10 |
| 22 | Cutting | Natural | (Laser beam) | 0.11 | 0.29 | 18 | 100 | 10 |
| 23 | Cleavage | Natural | Diamond | 0.58 | 0 | 12 | 30 | 10 |
| 24 | Cleavage | Natural | Blade | 0.31 | 0 | 8 | 50 | 10 |
| Example | | | | | | | | |
| 25 | Cleavage | Natural | Laser beam | 0.045 | 0 | 1.2 | 100 | 10 |
| 26 | Cleavage | Natural | Electron beam | 0.070 | 0 | 10.5 | 100 | 10 |
| 27 | Cleavage | Natural | Ion beam | 0.081 | 0 | 13.0 | 100 | 10 |
| 28 | Cleavage | Natural | Laser beam | 0.012 | 0 | 0.3 | 100 | 10 |

5.6. EXAMPLE 6

Employing the same method as in Example 5, each set consisted of ten (10) diamonds of 1.0–1.1. carat size and the diamonds were divided into 0.5 mm thick plates. The results are shown in Table 6.

Experiment No. 31 in table 6 shows that the objective of a plate of a 0.5 mm thickness could not be obtained using the process of Experiment No. 23.

All the dividing conditions were the same as in Experiment 5.

The plates manufactured by the previously described method were made into the following products.

1) Wire Drawing Dies

The plates were cut by laser into rectangular shapes. Then the rectangular pieces were holed and polished to be made into wire drawing dies.

2) Dressers

The plates were cut by laser into stick-like shapes. Thorn several pieces were mounted into steel shanks and finished as dressers.

3) Heatsinks

The top and bottom faces of the plates were polished and cut by laser into rectangular shapes. Next the surfaces were metalized. Then the heatsinks were finished. All products were produced at a lower cost than previous methods. Furthermore, the wire drawing dies and dressers demonstrated high and stable performance in abrasive tests.

TABLE 5

| Experiment No. | Method of dividing | Kind of diamond | Grooving method or cutting method | Mean surface flatness of the divided plane (mm) | Mean cutting width (mm) | Time of one division (min) | Yield (%) | Total Number of obtained plates |
|---|---|---|---|---|---|---|---|---|
| Comparison | | | | | | | | |
| 29 | Cutting | Natural | (Blade) | 0.19 | 0.20 | 45 | 77 | 57 |
| 30 | Cutting | Natural | (Laser beam) | 0.10 | 0.25 | 18 | 95 | 68 |
| 31 | Cleavage | Natural | Diamond | — | — | 12 | 0 | 0 |
| 32 | Cleavage | Natural | Blade | 0.28 | 0 | 8 | 11 | 13 |
| Example | | | | | | | | |
| 33 | Cleavage | Natural | Laser beam | 0.048 | 0 | 1.2 | 91 | 89 |
| 34 | Cleavage | Natural | Electron beam | 0.091 | 0 | 10.5 | 83 | 73 |
| 35 | Cleavage | Natural | Ion beam | 0.080 | 0 | 13.0 | 84 | 76 |
| 36 | Cleavage | Natural | Laser beam | 0.013 | 0 | 0.3 | 98 | 110 |

What is claimed is:

1. A synthetic single crystal diamond, said diamond containing 20–400 ppm nitrogen, said diamond having a first surface of a (111) face, said first surface having a plurality of steps on said (111) face, each step having a (111) face and being 5–100 μm in height.

2. The diamond according to claim 1 wherein said first surface has up to four stacked steps each of 5–100 μm in height.

3. The diamond according to claim 1, said diamond having a second opposite said first surface, said second surface being a (111) face having a plurality of stacked steps each of 5–100 μm in height.

* * * * *